United States Patent
Liu et al.

(10) Patent No.: US 10,985,226 B2
(45) Date of Patent: Apr. 20, 2021

(54) INK JET PRINTING ORGANIC LIGHT EMITTING DIODE DISPLAY PANEL AND MANUFACTURING METHOD THEREOF

(71) Applicant: Shenzhen China Star Optoelectronics Semiconductor Display Technology Co., Ltd., Guangdong (CN)

(72) Inventors: Zhaosong Liu, Guangdong (CN); Yuanjun Hsu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 390 days.

(21) Appl. No.: 16/009,569

(22) Filed: Jun. 15, 2018

(65) Prior Publication Data
US 2019/0214442 A1    Jul. 11, 2019

Related U.S. Application Data

(63) Continuation of application No. PCT/CN2018/078999, filed on Mar. 14, 2018.

(30) Foreign Application Priority Data
Jan. 9, 2018    (CN) .......................... 201810020262.2

(51) Int. Cl.
*H01L 27/32*    (2006.01)
*H01L 51/00*    (2006.01)
(Continued)

(52) U.S. Cl.
CPC ...... *H01L 27/3246* (2013.01); *H01L 27/3258* (2013.01); *H01L 51/0005* (2013.01);
(Continued)

(58) Field of Classification Search
CPC ............. H01L 27/3244; H01L 51/5218; H01L 27/3276; H01L 27/3246; H01L 51/0005;
(Continued)

(56) References Cited

U.S. PATENT DOCUMENTS

2006/0061525 A1    3/2006    Kim et al.
2010/0148283 A1*   6/2010    Shih ................. H01L 27/14689
                                                                257/415
(Continued)

FOREIGN PATENT DOCUMENTS

CN            105051932 A      11/2015

*Primary Examiner* — Mouloucoulaye Inoussa
(74) *Attorney, Agent, or Firm* — Leong C. Lei

(57) ABSTRACT

Provided are an ink jet printing organic light emitting diode display panel and a manufacturing method thereof. The method includes: sequentially forming a passivation layer and a planarization layer on a carrier substrate prepared with one pair of thin film transistors, wherein the passivation layer covers the one pair of thin film transistors; forming one pair of vias in the passivation layer and the planarization layer; forming one pair of anodes on the planarization layer, wherein the one pair of anodes are electrically connected to the one pair of thin film transistors through the one pair of vias in the passivation layer and the planarization layer; preparing an electrode separation layer between the one pair of anodes with $Al_2O_3$ or an organic photoresist material; forming a light emitting layer over the one pair of anodes by ink jet printing, wherein the light emitting layer covers the electrode separation layer.

12 Claims, 4 Drawing Sheets

(51) Int. Cl.
   *H01L 51/56* (2006.01)
   *H01L 51/50* (2006.01)
(52) U.S. Cl.
   CPC .......... *H01L 51/56* (2013.01); *H01L 51/5012* (2013.01); *H01L 2227/323* (2013.01); *H01L 2251/558* (2013.01)
(58) Field of Classification Search
   CPC . H01L 27/3258; H01L 51/56; H01L 51/5012; H01L 51/5253; H01L 51/5284; H01L 51/5088; H01L 51/5092; H01L 29/78663; H01L 29/6675; H01L 29/458; H01L 27/322; H01L 51/524; H01L 27/1248; H01L 27/1266; G02B 5/291; G02B 1/14; G02B 27/0172
   USPC ................................ 257/40, 66; 438/23, 666
   See application file for complete search history.

(56) References Cited

U.S. PATENT DOCUMENTS

| | | | | |
|---|---|---|---|---|
| 2012/0305952 | A1* | 12/2012 | Takei | H01L 27/3216 257/89 |
| 2014/0239266 | A1* | 8/2014 | Kim | H01L 51/0013 257/40 |
| 2015/0333110 | A1* | 11/2015 | Park | H01L 27/3248 257/40 |
| 2016/0372670 | A1* | 12/2016 | Min | H01L 51/0005 |
| 2017/0005144 | A1* | 1/2017 | Akagawa | G02B 27/0172 |

\* cited by examiner

INK JET PRINTING ORGANIC LIGHT EMITTING DIODE DISPLAY PANEL AND MANUFACTURING METHOD THEREOF

CROSS-REFERENCE TO RELATED APPLICATION

This application is a continuing application of PCT Patent Application No. PCT/CN2018/078999 entitled "Ink jet printing organic light emitting diode display panel and manufacturing method thereof", filed on Mar. 14, 2018, which claims priority to Chinese Patent Application No. 201810020262.2, filed on Jan. 9, 2018, both of which are hereby incorporated in its entireties by reference.

FIELD OF THE INVENTION

The present invention relates to a display field, and more particularly to an ink jet printing organic light emitting diode display panel and a manufacturing method thereof.

BACKGROUND OF THE INVENTION

As manufacturing an OLED (Organic Light-Emitting Diode) display panel, an OLED display panel pixel is prepared by an IJP (ink-jet printing) process. The OLED display panel is referred as an ink-jet printing OLED display panel. In order to reduce the difficulty of the IJP process, a 2 in 1 pixel structure is designed. As shown in FIG. 1, one pixel 10' of an ink-jet printing OLED display panel includes two sub pixels 101'. Such design can utilize the space more effectively to improve the resolution; meanwhile, the design can accomplish the preparation of 2 sub pixels in one printing and can improve the preparation efficiency of the sub pixels.

For printing two sub pixels at one time, a SiO process is introduced as an electrode separation layer in addition to the array substrate process. As shown in FIG. 2, the two anodes 5' and the light emitting layers 8' over the two anodes 5' constitute two sub pixels 101', together. The electrode separation layer 6' is configured between the two anodes 5'. The number 9' indicates a cathode. The numbers 1', 2', 3', 4' and 7' respectively indicate a thin film transistor, a substrate, a passivation layer, a planarization layer and a pixel definition layer. With verification, the SiO process will cause degradation of thin film transistors.

SUMMARY OF THE INVENTION

For solving the aforesaid technical issue, the present invention provides an ink jet printing organic light emitting diode display panel and a manufacturing method thereof, which can improve performance of thin film transistors in the ink jet printing organic light emitting diode display panel without reducing the mobility of the thin film transistors, and can also effectively suppress the threshold voltage drift.

The present invention provides a manufacturing method of an ink jet printing organic light emitting diode display panel, comprising steps of:

sequentially forming a passivation layer and a planarization layer on a carrier substrate prepared with at least one pair of thin film transistors, wherein the passivation layer covers the at least one pair of thin film transistors;

forming at least one pair of vias in the passivation layer and the planarization layer;

forming at least one pair of anodes on the planarization layer, wherein the at least one pair of anodes are electrically connected to the at least one pair of thin film transistors through the at least one pair of vias in the passivation layer and the planarization layer;

preparing an electrode separation layer between the at least one pair of anodes with $Al_2O_3$ or an organic photoresist material;

forming a light emitting layer over the at least one pair of anodes by ink jet printing, wherein the light emitting layer covers the electrode separation layer.

Preferably, before the step of forming the light emitting layer over the at least one pair of anodes, the manufacturing method further comprises steps of:

forming a pixel definition layer on the planarization layer, wherein the planarization layer covers the at least one pair of anodes;

patterning the pixel definition layer by photolithography to expose the electrode separation layer and the at least one pair of anodes.

Preferably, the pixel definition layer comprises at least one photoresist layer, and a thickness range of the pixel definition layer is from 10,000 angstroms to 20,000 angstroms.

Preferably, the manufacturing method further comprises a step of:

preparing a cathode on the light emitting layer.

Preferably, a thickness range of the passivation layer is from 1,000 angstroms to 5,000 angstroms, and the passivation layer comprises at least one layer of SiOx and/or SiNx;

a thickness range of the planarization layer is from 10,000 angstroms to 20,000 angstroms, and a material of the planarization layer is a photoresist material.

Preferably, the step of forming the at least one pair of anodes on the planarization layer comprises:

forming a conductive film material layer on the planarization layer, wherein a thickness range of the conductive film material layer is from 500 angstroms to 1,000 angstroms;

patterning the conductive film material layer by photolithography to obtain the at least one pair of anodes.

Preferably, the step of preparing the electrode separation layer between the at least one pair of anodes with $Al_2O_3$ or the organic photoresist material comprises:

depositing $Al_2O_3$ by atomic layer deposition or coating at least one organic photoresist material between the at least one pair of anodes;

patterning the deposited $Al_2O_3$ or the organic photoresist material by photolithography.

The present invention further provides a manufacturing method of an ink jet printing organic light emitting diode display panel, comprising steps of:

sequentially forming a passivation layer and a planarization layer on a carrier substrate prepared with at least one pair of thin film transistors, wherein the passivation layer covers the at least one pair of thin film transistors;

forming at least one pair of vias in the passivation layer and the planarization layer;

forming at least one pair of anodes on the planarization layer, wherein the at least one pair of anodes are electrically connected to the at least one pair of thin film transistors through the at least one pair of vias in the passivation layer and the planarization layer;

preparing an electrode separation layer between the at least one pair of anodes with $Al_2O_3$ or an organic photoresist material;

forming a light emitting layer over the at least one pair of anodes by ink jet printing, wherein the light emitting layer covers the electrode separation layer;

preparing a cathode on the light emitting layer.

Preferably, before the step of forming the light emitting layer over the at least one pair of anodes, the manufacturing method further comprises steps of:

forming a pixel definition layer on the planarization layer, wherein the planarization layer covers the at least one pair of anodes;

patterning the pixel definition layer by photolithography to expose the electrode separation layer and the at least one pair of anodes.

Preferably, the pixel definition layer comprises at least one photoresist layer, and a thickness range of the pixel definition layer is from 10,000 angstroms to 20,000 angstroms.

Preferably, a thickness range of the passivation layer is from 1,000 angstroms to 5,000 angstroms, and the passivation layer comprises at least one layer of SiOx and/or SiNx;

a thickness range of the planarization layer is from 10,000 angstroms to 20,000 angstroms, and a material of the planarization layer is a photoresist material.

Preferably, the step of forming the at least one pair of anodes on the planarization layer comprises:

forming a conductive film material layer on the planarization layer, wherein a thickness range of the conductive film material layer is from 500 angstroms to 1,000 angstroms;

patterning the conductive film material layer by photolithography to obtain the at least one pair of anodes.

Preferably, the step of preparing the electrode separation layer between the at least one pair of anodes with $Al_2O_3$ or the organic photoresist material comprises:

depositing $Al_2O_3$ by atomic layer deposition or coating at least one organic photoresist material between the at least one pair of anodes;

patterning the deposited $Al_2O_3$ or the organic photoresist material by photolithography.

The present invention further provides an ink jet printing organic light emitting diode display panel, comprising: at least one pair of thin film transistors, and a passivation layer and a planarization layer, which are sequentially formed on the at least one pair of thin film transistors, wherein at least one pair of vias are arranged in the passivation layer and the planarization layer, and the at least one pair of vias are arranged in the passivation layer and the planarization layer are located on the at least one pair of thin film transistors;

at least one pair of anodes are arranged on the planarization layer, and the at least one pair of anodes are electrically connected to the at least one pair of thin film transistors through the at least one pair of vias in the passivation layer and the planarization layer;

an electrode separation layer is arranged between the at least one pair of anodes, and a material of the electrode separation layer is $Al_2O_3$ or an organic photoresist material.

Preferably, a pixel definition layer is further formed on the planarization layer, an opening is arranged in the pixel defining layer, and the opening is located above the at least one pair of anodes;

a light emitting layer is arranged in the opening of the pixel definition layer, and the light emitting layer covers the electrode separation layer;

a cathode is arranged on the light emitting layer.

Preferably, the pixel definition layer comprises at least one photoresist layer, and a thickness range of the pixel definition layer is from 10,000 angstroms to 20,000 angstroms;

a thickness range of the passivation layer is from 1,000 angstroms to 5,000 angstroms, and the passivation layer comprises at least one layer of SiOx and/or SiNx;

a thickness range of the planarization layer is from 10,000 angstroms to 20,000 angstroms, and a material of the planarization layer is a photoresist material.

The implementation of the present invention possesses the benefits: as an ink jet printing organic light emitting diode display panel is manufactured, an electrode separation layer is prepared between the two of anodes in the same pixel with Al2O3 or the organic photoresist material. The Al2O3 or the organic photoresist material will not influence the formation of the light emitting layer by ink jet printing. Since the $Al_2O_3$ and organic photoresist materials do not contain hydrogen bonds and hydrogen ions and do not reduce the mobility of thin film transistors, and can also effectively suppress the threshold voltage drift, thus do not cause degradation of thin film transistors in the ink jet printing organic light emitting diode display panel and extend the service lifetime of the ink jet printing organic light emitting diode display panel.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Figure 1:
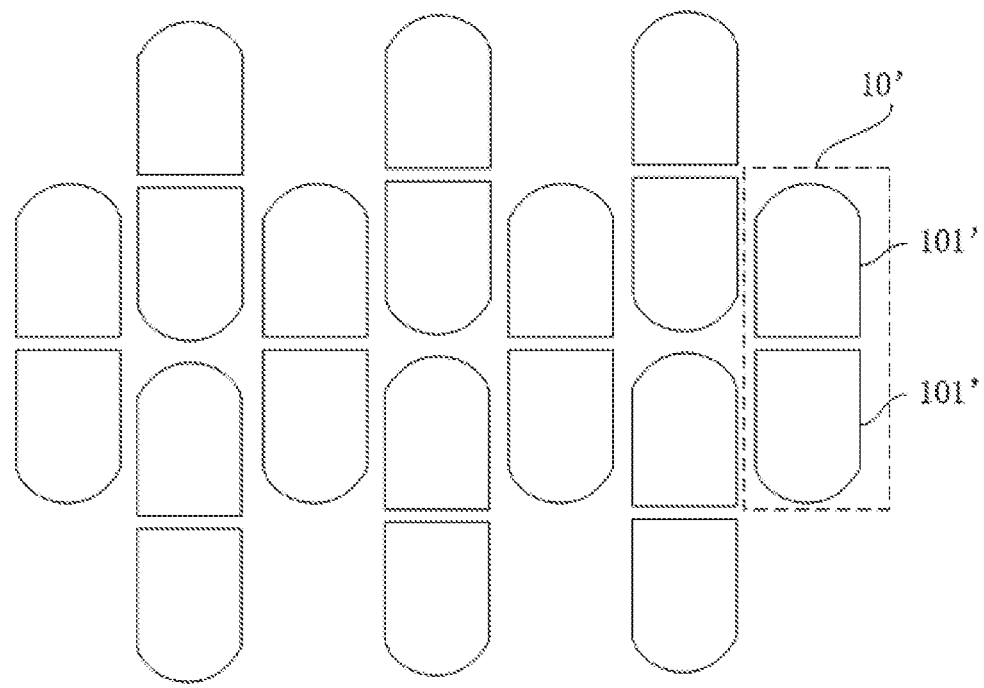
FIG. 1 is a diagram of a pixel structure in an ink jet printing organic light emitting diode display panel provided by the present invention.
Figure 2:
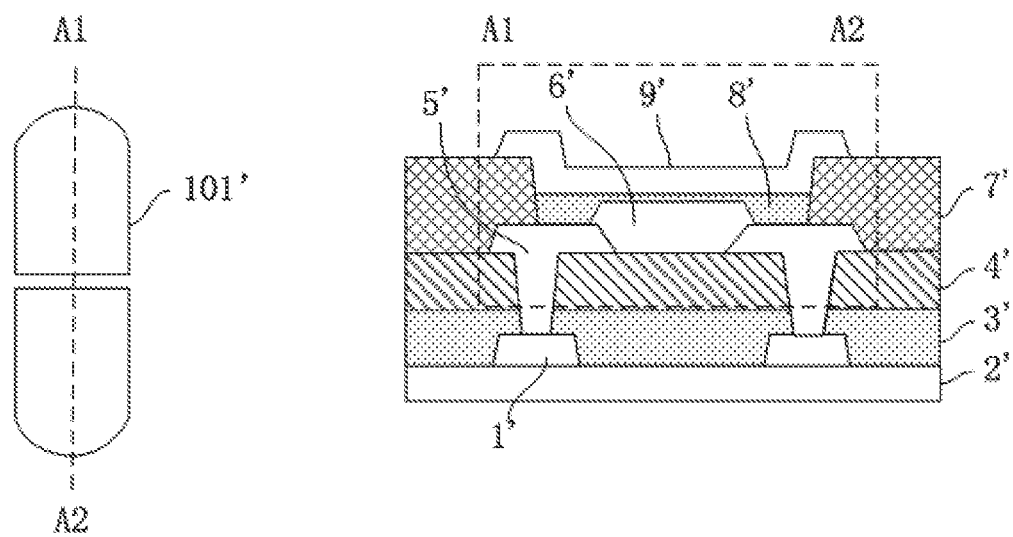
FIG. 2 is a sectional diagram of a pixel provided by the present invention.
Figure 3:
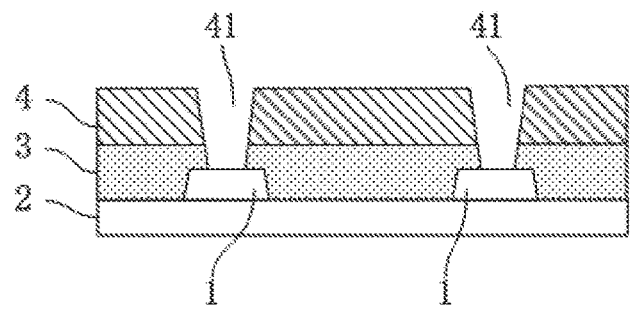
FIG. 3 is a diagram of a passivation layer and a planarization layer formed on a thin film transistor provided by the present invention.
Figure 4:
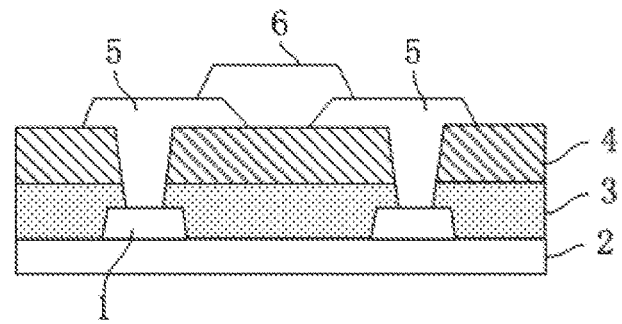
FIG. 4 is a diagram of anodes and an electrode separation layer formed on a planarization layer provided by the present invention.

The present invention provides a manufacturing method of an ink jet printing organic light emitting diode display panel, comprising steps of:

as shown in FIG. 3, sequentially forming a passivation layer 3 and a planarization layer 4 on a carrier substrate 2 prepared with at least one pair of thin film transistors 1, wherein the passivation layer 3 covers the at least one pair of thin film transistors 1;

forming at least one pair of vias 41 in the passivation layer 3 and the planarization layer 4;

as shown in FIG. 4, forming at least one pair of anodes 5 on the planarization layer 4, wherein the at least one pair of anodes 5 are electrically connected to the at least one pair of thin film transistors 1 through the at least one pair of vias 41 in the passivation layer 3 and the planarization layer 4;

preparing an electrode separation layer 6 between the at least one pair of anodes 5 with $Al_2O_3$ or an organic photoresist material;

forming a light emitting layer 8 over the at least one pair of anodes 5 by ink jet printing, wherein the light emitting layer 8 covers the electrode separation layer 6.

Figure 5:
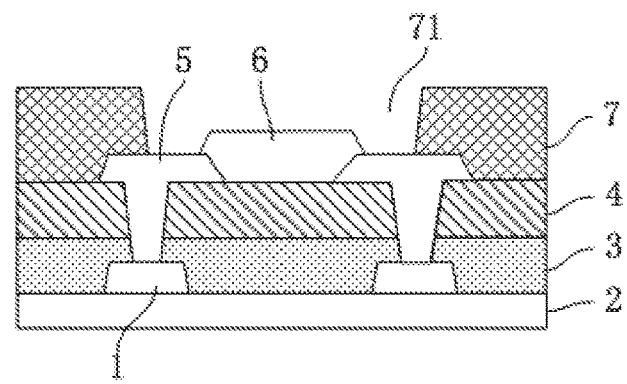
FIG. 5 is a diagram of a pixel definition layer formed on a planarization layer provided by the present invention.

Furthermore, before the step of forming the light emitting layer 8 over the at least one pair of anodes 5, the manufacturing method further comprises steps of:

as shown in FIG. 5, forming a pixel definition layer 7 on the planarization layer 4, wherein the planarization layer 4 covers the at least one pair of anodes 5;

patterning the pixel definition layer 7 by photolithography to expose the electrode separation layer 6 and the at least one pair of anodes 5.

The pixel definition layer 7 comprises at least one photoresist layer, and a thickness range of the pixel definition layer 7 is from 10,000 angstroms to 20,000 angstroms.

Figure 6:
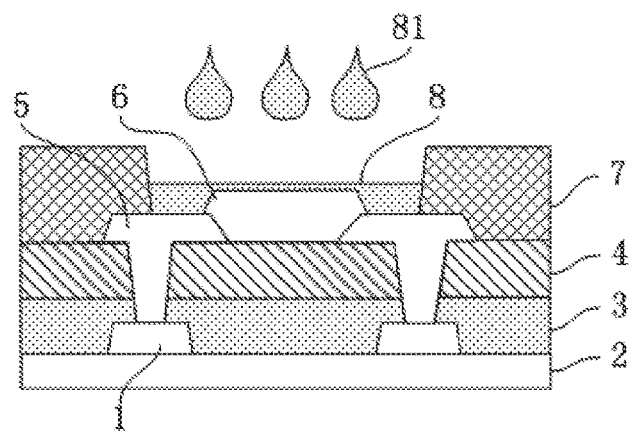
FIG. 6 is a diagram of preparation of a light emitting layer provided by the present invention.

As shown in FIG. 6, the light emitting layer 8 is formed over the at least one pair of anodes 5 by ink jet printing. The number 81 is a liquid of anode material.

Figure 7:
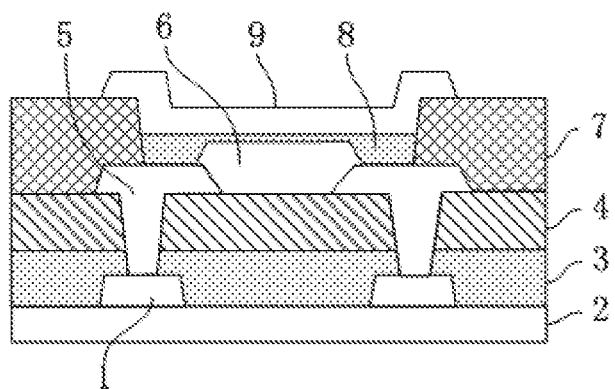
FIG. 7 is a diagram of preparation of a cathode provided by the present invention.

Furthermore, the manufacturing method of the ink jet printing organic light emitting diode display panel further comprises a step of: as shown in FIG. 7, preparing a cathode 9 on the light emitting layer 8.

Furthermore, a thickness range of the passivation layer 3 is from 1,000 angstroms to 5,000 angstroms, and the passivation layer 3 comprises at least one layer of SiOx and/or SiNx; a thickness range of the planarization layer 4 is from 10,000 angstroms to 20,000 angstroms, and a material of the planarization layer 4 is a photoresist material.

Furthermore, the step of forming the at least one pair of anodes 5 on the planarization layer 4 comprises:

forming a conductive film material layer on the planarization layer 4, wherein a thickness range of the conductive film material layer is from 500 angstroms to 1,000 angstroms;

patterning the conductive film material layer by photolithography to obtain the at least one pair of anodes 5.

Furthermore, the step of preparing an electrode separation layer 6 between the at least one pair of anodes 5 with $Al_2O_3$ or the organic photoresist material comprises:

depositing $Al_2O_3$ or coating of at least one organic photoresist material between the at least one pair of anodes 5 by atomic layer deposition;

patterning the deposited $Al_2O_3$ or the organic photoresist material by photolithography.

Specifically, in the case of patterning the pixel definition layer by photolithography, generally, a photoresist is first coated on the film layer, and then exposure and development are performed by photolithography, and the photoresist layer exposed by the exposure and development is used as a stopper layer for etching the patterned film layer.

The present invention further provides an ink jet printing organic light emitting diode display panel. As shown in FIG. 7, the display panel comprises: at least one pair of thin film transistors 1, and a passivation layer 3 and a planarization layer 4, which are sequentially formed on the at least one pair of thin film transistors 1, wherein at least one pair of vias are arranged in the passivation layer 3 and the planarization layer 4, and the at least one pair of vias are arranged in the passivation layer 3 and the planarization layer 4 are located on the at least one pair of thin film transistors 1;

at least one pair of anodes 5 are arranged on the planarization layer 4, and the at least one pair of anodes 5 are electrically connected to the at least one pair of thin film transistors 1 through the at least one pair of vias in the passivation layer 3 and the planarization layer 4;

an electrode separation layer 6 is arranged between the at least one pair of anodes 5, and a material of the electrode separation layer 6 is $Al_2O_3$ or an organic photoresist material.

Furthermore, a pixel definition layer 7 is further formed on the planarization layer 4, an opening 71 shown in FIG. 5 is arranged in the pixel defining layer 7, and the opening 71 is located above the at least one pair of anodes 5.

A light emitting layer 8 is arranged in the opening 71 of the pixel definition layer 7, and the light emitting layer 8 covers the electrode separation layer 6; a cathode 9 is arranged on the light emitting layer 8.

Furthermore, the pixel definition layer 7 comprises at least one photoresist layer, and a thickness range of the pixel definition layer 7 is from 10,000 angstroms to 20,000 angstroms; a thickness range of the passivation layer 3 is from 1,000 angstroms to 5,000 angstroms, and the passivation layer 3 comprises at least one layer of SiOx and/or SiNx; a thickness range of the planarization layer 4 is from 10,000 angstroms to 20,000 angstroms, and a material of the planarization layer 4 is a photoresist material.

Figure 8:
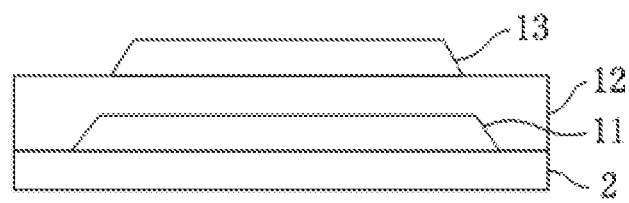
FIG. 8 is a diagram of preparation of a light shielding layer, a buffer layer and a semiconductor layer provided by the present invention.

In another embodiment provided by the present invention, the manufacturing method of an ink jet printing organic light emitting diode display panel, comprising steps of:

1. cleaning the glass substrate 2, as shown in FIG. 8, and depositing a layer of metal with a thickness of 500 angstroms to 2,000 angstroms on the glass substrate 2 as the light shielding layer 11 of the thin film transistor 1. The metal of the light shielding layer 11 may be Mo, Al, Cu, Ti or an alloy of these metals, such as, one of molybdenum alloy, aluminum alloy, copper alloy and titanium alloy. Photolithography is used for patterning.

2. depositing a layer of SiOx film as a buffer layer 12 with a thickness of 1,000 angstroms to 5,000 angstroms.

3. depositing a layer of metal oxide semiconductor (Oxide) as a semiconductor layer 13, which can be IGZO (Indium Gallium Zinc Oxide), IZTO (Indium Zinc Tin Oxide), IGZTO (Indium Gallium Zinc Tin Oxide) with a thickness of 100 angstroms to 1,000 angstroms. Photolithography is used for patterning.

Figure 9:
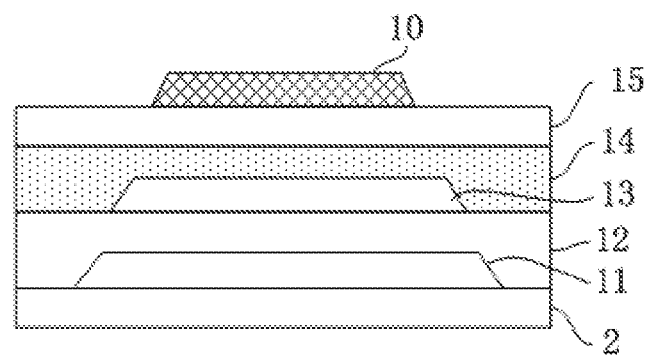
FIG. 9 is a diagram of a gate insulation layer, a gate metal layer and a photoresist layer provided by the present invention.

4. as shown in FIG. 9, depositing a layer of SiOx thin film as the gate insulation layer 14 with a thickness of 1,000 angstroms to 3,000 angstroms.

5. depositing a layer of metal as the gate metal layer 15, which can be Mo, Al, Cu, Ti or an alloy of these metals with a thickness of 2,000 angstroms to 8,000 angstroms.

Figure 10:
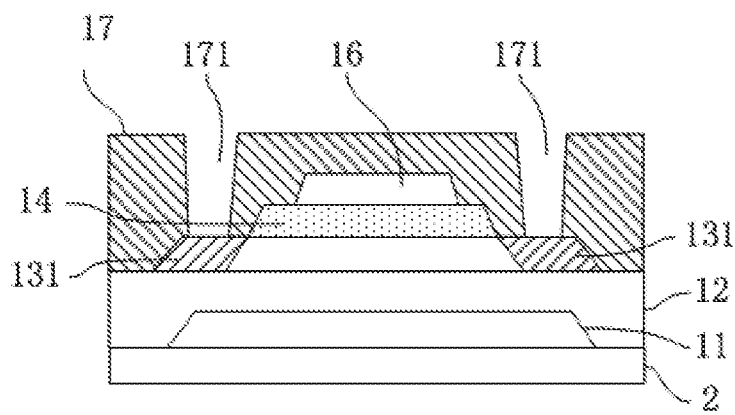
FIG. 10 is a diagram of an interlayer insulation layer provided by the present invention.

6. forming the photoresist layer on the gate metal layer 15 and utilizing photolithography to obtain the patterned photoresist layer 10 in FIG. 9, and then employing the photoresist layer 10 as the stopper layer to etch and form the pattern of the gate metal layer 15, and then employing the gate metal pattern 16 in FIG. 10 for self-alignment for etching to form the gate insulation layer 14. The gate insulation layer 14 only exists under the gate metal pattern 16. The rest of the gate insulation layer 14 will be etched.

7. implementing the plasma process for the entire surface to significantly reduce the resistance of the metal oxide semiconductor material without protection of the gate insulation layer 14 and the gate metal pattern 16 to form the N+ conductor layer 131 as the source contact and the drain contact; the metal oxide semiconductor material under the gate insulation layer 14 is not processed and the semiconductor characteristics are maintained as the channel of the thin film transistor 1.

8. as shown in FIG. 10, depositing the interlayer insulation layer 17 (ILD layer), which can be a sandwich structure of SiOx, SiNx or SiOx and SiNx. The thickness of the interlayer insulation layer 17 is from 3,000 angstroms to 10,000 angstroms, and the source and drain contact area openings 171 are prepared.

Figure 11:
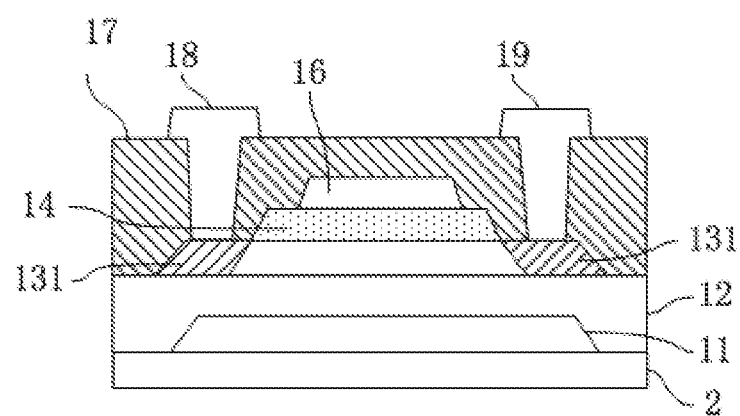
FIG. 11 is a structural diagram f a thin film transistor provided by the present invention.

9. as shown in FIG. 11, depositing a layer of metal as the source-drain metal layer, which can be Mo, Al, Cu, Ti or an alloy of these metals with a thickness of 2,000 angstroms to 8,000 angstroms. Then, the pattern is defined to form the source 18 and the drain 19.

10. depositing a SiOx thin film as the passivation layer 3 in FIG. 3 with a thickness of 1,000 angstroms to 5,000 angstroms, and etching a via.

11. preparing the planarization layer 4 (PLN layer), which can be a photoresist layer of various compositions with a thickness of 10,000 angstroms to 20,000 angstroms. Vias are formed by photolithography.

12. depositing the anodes 5 in FIG. 5, which can be made of a transparent oxide, such as ITO (Indium Tin Oxide) with a thickness of 500 angstroms to 1,000 angstroms. Photolithography is used for patterning.

13. preparing the electrode separation layer 6, which can have many options but H (hydrogen bonds, hydrogen ions, etc.) cannot be introduced. For instance, a layer of $Al_2O_3$ can be deposited by atomic layer deposition. Then, the pattern is formed by photolithography: or, organic photoresists of various types are directly coated, and photolithography is used for patterning.

14. preparing the pixel definition layer 7 (PDL layer) in FIG. 5, which can comprise a photoresist layer of various compositions with a thickness of 10,000 angstroms to 20,000 angstroms. The light emitting area is defined by photolithography to complete the production of back plate.

In conclusion, as an ink jet printing organic light emitting diode display panel is manufactured, an electrode separation layer is prepared between the two of anodes in the same pixel with $Al_2O_3$ or the organic photoresist material. The $Al_2O_3$ or the organic photoresist material will not influence the formation of the light emitting layer by ink jet printing. Since the $Al_2O_3$ and organic photoresist materials do not contain hydrogen bonds and hydrogen ions and do not reduce the mobility of thin film transistors, and can also effectively suppress the threshold voltage drift, thus do not cause degradation of thin film transistors in the ink jet printing organic light emitting diode display panel and extend the service lifetime of the ink jet printing organic light emitting diode display panel.

The above content with the specific preferred embodiments of the present invention is further made to the detailed description, the specific embodiments of the present invention should not be considered limited to these descriptions. Those of ordinary skill in the art for the present invention, without departing from the spirit of the present invention, can make various simple deductions or replacements, should be deemed to belong to the scope of the present invention.

What is claimed is:

1. A manufacturing method of an ink jet printing organic light emitting diode display panel, comprising steps of:
    sequentially forming a passivation layer and a planarization layer on a carrier substrate prepared with at least one pair of thin film transistors, wherein the passivation layer covers the at least one pair of thin film transistors;
    forming at least one pair of vias in the passivation layer and the planarization layer;
    forming at least one pair of anodes in a same pixel on the planarization layer, wherein the at least one pair of anodes are electrically connected to the at least one pair of thin film transistors through the at least one pair of vias in the passivation layer and the planarization layer;
    preparing an electrode separation layer between the at least one pair of anodes in the same pixel with $Al_2O_3$ or an organic photoresist material;
    forming a light emitting layer over the at least one pair of anodes in the same pixel by ink jet printing, wherein the light emitting layer covers the electrode separation layer to be in contact with the at least one pair of anodes in the same pixel.

2. The manufacturing method of an ink jet printing organic light emitting diode display panel according to claim 1, further comprising a step of:
    preparing a cathode on the light emitting layer.

3. The manufacturing method of an ink jet printing organic light emitting diode display panel according to claim 1, wherein
    a thickness range of the passivation layer is from 1,000 angstroms to 5,000 angstroms, and the passivation layer comprises at least one layer of SiOx and/or SiNx;
    a thickness range of the planarization layer is from 10,000 angstroms to 20,000 angstroms, and a material of the planarization layer is a photoresist material.

4. The manufacturing method of an ink jet printing organic light emitting diode display panel according to claim 1, wherein the step of forming the at least one pair of anodes on the planarization layer comprises:
    forming a conductive film material layer on the planarization layer, wherein a thickness range of the conductive film material layer is from 500 angstroms to 1,000 angstroms;
    patterning the conductive film material layer by photolithography to obtain the at least one pair of anodes.

5. The manufacturing method of an ink jet printing organic light emitting diode display panel according to claim 1, wherein the step of preparing the electrode separation layer between the at least one pair of anodes with $Al_2O_3$ or the organic photoresist material comprises:
    depositing $Al_2O_3$ by atomic layer deposition or coating at least one organic photoresist material between the at least one pair of anodes;
    patterning the deposited $Al_2O_3$ or the organic photoresist material by photolithography.

6. A manufacturing method of an ink jet printing organic light emitting diode display panel, comprising steps of:
    sequentially forming a passivation layer and a planarization layer on a carrier substrate prepared with at least one pair of thin film transistors, wherein the passivation layer covers the at least one pair of thin film transistors;
    forming at least one pair of vias in the passivation layer and the planarization layer;
    forming at least one pair of anodes in a same pixel on the planarization layer, wherein the at least one pair of anodes are electrically connected to the at least one pair of thin film transistors through the at least one pair of vias in the passivation layer and the planarization layer;

preparing an electrode separation layer between the at least one pair of anodes in the same pixel with $Al_2O_3$ or an organic photoresist material;

forming a light emitting layer over the at least one pair of anodes in the same pixel by ink jet printing, wherein the light emitting layer covers the electrode separation layer to be in contact with the at least one pair of anodes in the same pixel;

preparing a cathode on the light emitting layer.

7. The manufacturing method of an ink jet printing organic light emitting diode display panel according to claim 6, wherein a thickness range of the passivation layer is from 1,000 angstroms to 5,000 angstroms, and the passivation layer comprises at least one layer of SiOx and/or SiNx;

a thickness range of the planarization layer is from 10,000 angstroms to 20,000 angstroms, and a material of the planarization layer is a photoresist material.

8. The manufacturing method of an ink jet printing organic light emitting diode display panel according to claim 6, wherein the step of forming the at least one pair of anodes on the planarization layer comprises:

forming a conductive film material layer on the planarization layer, wherein a thickness range of the conductive film material layer is from 500 angstroms to 1,000 angstroms;

patterning the conductive film material layer by photolithography to obtain the at least one pair of anodes.

9. The manufacturing method of an ink jet printing organic light emitting diode display panel according to claim 6, wherein the step of preparing the electrode separation layer between the at least one pair of anodes with $Al_2O_3$ or the organic photoresist material comprises:

depositing $Al_2O_3$ by atomic layer deposition or coating at least one organic photoresist material between the at least one pair of anodes;

patterning the deposited $Al_2O_3$ or the organic photoresist material by photolithography.

10. An ink jet printing organic light emitting diode display panel, comprising: at least one pair of thin film transistors, and a passivation layer and a planarization layer, which are sequentially formed on the at least one pair of thin film transistors, wherein at least one pair of vias are arranged in the passivation layer and the planarization layer, and the at least one pair of vias are arranged in the passivation layer and the planarization layer are located on the at least one pair of thin film transistors;

at least one pair of anodes are arranged on the planarization layer, and the at least one pair of anodes are electrically connected to the at least one pair of thin film transistors through the at least one pair of vias in the passivation layer and the planarization layer;

an electrode separation layer is arranged between the at least one pair of anodes, and a material of the electrode separation layer is $Al_2O_3$ or an organic photoresist material.

11. The ink jet printing organic light emitting diode display panel according to claim 10, wherein a pixel definition layer is further formed on the planarization layer, an opening is arranged in the pixel defining layer, and the opening is located above the at least one pair of anodes;

a light emitting layer is arranged in the opening of the pixel definition layer, and the light emitting layer covers the electrode separation layer;

a cathode is arranged on the light emitting layer.

12. The ink jet printing organic light emitting diode display panel according to claim 10, wherein the pixel definition layer comprises at least one photoresist layer, and a thickness range of the pixel definition layer is from 10,000 angstroms to 20,000 angstroms;

a thickness range of the passivation layer is from 1,000 angstroms to 5,000 angstroms, and the passivation layer comprises at least one layer of SiOx and/or SiNx;

a thickness range of the planarization layer is from 10,000 angstroms to 20,000 angstroms, and a material of the planarization layer is a photoresist material.

\* \* \* \* \*